United States Patent
Lai et al.

(10) Patent No.: US 9,837,793 B1
(45) Date of Patent: Dec. 5, 2017

(54) SEMICONDUCTOR LIGHT-EMITTING DEVICE

(71) Applicant: PlayNitride Inc., Tainan (TW)

(72) Inventors: Yen-Lin Lai, Tainan (TW); Jyun-De Wu, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/412,862

(22) Filed: Jan. 23, 2017

(30) Foreign Application Priority Data

Nov. 10, 2016 (TW) .............................. 105136570 A

(51) Int. Cl.
| | | |
|---|---|---|
| H01S 5/00 | (2006.01) |
| H01S 5/30 | (2006.01) |
| H01S 5/20 | (2006.01) |
| H01L 33/06 | (2010.01) |
| H01S 5/10 | (2006.01) |
| H01L 33/04 | (2010.01) |

(52) U.S. Cl.
CPC .......... *H01S 5/3054* (2013.01); *H01S 5/2018* (2013.01); *H01S 5/2031* (2013.01); *H01S 5/3095* (2013.01); *H01L 33/04* (2013.01); *H01L 33/06* (2013.01); *H01S 5/1028* (2013.01)

(58) Field of Classification Search
CPC ..... H01S 5/3054; H01S 5/3095; H01L 33/04; H01L 33/06
See application file for complete search history.

(56) References Cited

U.S. PATENT DOCUMENTS 6,285,697 B1 * 9/2001 Landwehr .............. B82Y 20/00
372/45.01

* cited by examiner

*Primary Examiner* — Armando Rodriguez
(74) *Attorney, Agent, or Firm* — J.C. Patents

(57) ABSTRACT

A semiconductor light-emitting device including a light-emitting layer, a first N-type waveguide layer and a plurality of semiconductor layers is provided. The light light-emitting layer has a first side and a second side opposite to the first side. The first N-type waveguide layer is disposed at the first side, and the semiconductor layers are disposed at the second side. The semiconductor layers include at least one P-type semiconductor layer and a plurality of N-type semiconductor layers, and a quantity of the N-type semiconductor layers is more than a quantity of the at least one P-type semiconductor layer.

10 Claims, 2 Drawing Sheets

US 9,837,793 B1

SEMICONDUCTOR LIGHT-EMITTING DEVICE

CROSS-REFERENCE TO RELATED APPLICATION

This application claims the priority benefit of Taiwan application serial no. 105136570, filed on Nov. 10, 2016. The entirety of the above-mentioned patent application is hereby incorporated by reference herein and made a part of this specification.

BACKGROUND OF THE INVENTION

1. Field of the Invention

The present invention generally relates to a light-emitting device, in particular, to a semiconductor light-emitting device.

2. Description of Related Art

As the vigorous development of semiconductor technology, the invention of semiconductor light-emitting devices such as a light-emitting diode and a laser diode have made a great difference in people's lives. The light-emitting diode has various advantages of being power efficient, having a small volume, short response time, long lifetime and so forth. The light-emitting diode has been widely applied in the fields of display and illumination. In addition, the laser diode has advantages of being power efficient, having a small volume, a light weight, a low price and so forth. The laser diode has been widely applied in the fields of optical fiber transmission, optical disk, laser printer, laser scanner, laser pointer and so forth.

A conventional light-emitting manner of the semiconductor light-emitting device is applying electrical current on a N-type semiconductor layer and a P-type semiconductor layer, such that electrons and holes are recombined at a light-emitting layer between the N-type semiconductor layer and the P-type semiconductor layer, so as to emit light. In addition, the light would pass through the semiconductor layers, and would be emitted from the semiconductor light-emitting device, in order to realize electroluminescence. In general, the P-type semiconductor layer is doped by a Mg element, thus the electroluminescence of the semiconductor light-emitting device is realized by a semiconductor property of the Mg-doped P-type semiconductor layer. However, the afore-mentioned doped P-type semiconductor layer exhibits an enhanced light absorption ability, which is, for example, larger than a light absorption ability of the N-type semiconductor layer. Therefore, a part of the light passing through the P-type semiconductor layer would be absorbed, which results in an optical loss to a certain extent of the semiconductor light-emitting device. As a result, it is difficult to improve a light-emitting efficiency of the semiconductor light-emitting device.

SUMMARY OF THE INVENTION

Accordingly, the present invention is directed to a semiconductor light-emitting device, which has a relatively low optical loss and an improved light-emitting efficiency.

A semiconductor light-emitting device of embodiments of the present invention includes a light-emitting layer, a first N-type waveguide layer and a plurality of semiconductor layers. The light-emitting layer has a first side and a second side opposite to the first side. The first N-type waveguide layer is disposed at the first side, and the semiconductor layers are disposed at the second side. The semiconductor layers include at least one P-type semiconductor layer and a plurality of N-type semiconductor layers, and a quantity of the N-type semiconductor layers is more than a quantity of the at least one P-type semiconductor layer.

In an embodiment of the present invention, the afore-mentioned at least one P-type semiconductor layer includes a P-type waveguide layer, the N-type semiconductor layers include a second N-type waveguide layer disposed at a side of the P-type waveguide layer.

In an embodiment of the present invention, a tunnelling junction is formed between the afore-mentioned P-type waveguide layer and the afore-mentioned second N-type waveguide layer.

In an embodiment of the present invention, the afore-mentioned P-type waveguide layer is doped with a P-type dopant of a concentration in a range of $10^{18}$ atoms/cm$^3$ to $10^{20}$ atoms/cm$^3$, and the second N-type waveguide layer is doped with a N-type dopant of a concentration in a range of $10^{18}$ atoms/cm$^3$ to $10^{20}$ atoms/cm$^3$.

In an embodiment of the present invention, the afore-mentioned semiconductor layers further include an unintentionally doped waveguide layer disposed between the P-type waveguide layer and the light-emitting layer.

In an embodiment of the present invention, materials of the afore-mentioned waveguide layers include InGaN or GaN.

In an embodiment of the present invention, the afore-mentioned semiconductor light-emitting device further includes a first N-type semiconductor material layer and a first N-type semiconductor cladding layer, the first N-type semiconductor material layer and the first N-type semiconductor cladding layer are disposed at the first side, wherein the first N-type semiconductor cladding layer is disposed between the first N-type semiconductor material layer and the first N-type waveguide layer, and the first N-type waveguide layer is disposed between the first N-type semiconductor cladding layer and the light-emitting layer.

In an embodiment of the present invention, the afore-mentioned N-type semiconductor layers include a second N-type semiconductor material layer and a second N-type semiconductor cladding layer, the second N-type semiconductor cladding layer is disposed between the second N-type semiconductor material layer and the second N-type waveguide layer, and the second N-type waveguide layer is disposed between the second N-type semiconductor cladding layer and the light-emitting layer.

In an embodiment of the present invention, the afore-mentioned N-type semiconductor layers further include an electron blocking layer disposed between the second N-type semiconductor cladding layer and the second N-type waveguide layer, wherein a band-gap of the electron blocking layer is larger than a band-gap of the light-emitting layer.

In an embodiment of the present invention, the afore-mentioned semiconductor light-emitting device further includes a semiconductor contact layer. The second N-type semiconductor material layer is disposed between the semiconductor contact layer and the second N-type semiconductor cladding layer.

In an embodiment of the present invention, the afore-mentioned semiconductor contact layer is N-type doped with a doping concentration in a range of $10^{19}$ atoms/cm$^3$ to $10^{21}$ atoms/cm$^3$.

In an embodiment of the present invention, a quantity of the afore-mentioned at least one P-type semiconductor layer is one.

As above, the first N-type waveguide layer of the semiconductor light-emitting device of the embodiments of the present invention is disposed at the first side of the light-emitting layer, and the semiconductor layers are disposed at the second side of the light-emitting layer. The semiconductor layers include at least one P-type semiconductor layer and a plurality of N-type semiconductor layers, and a quantity of the N-type semiconductor layers is more than a quantity of the at least one P-type semiconductor layer. Specifically, because of the quantity of the P-type semiconductor layer of the embodiments of the present invention is relatively less, so that the P-type semiconductor layer has a relatively low absorption amount of light emitted by the light-emitting layer. As a result, an optical loss of the semiconductor light-emitting device is relatively less, so that the semiconductor light-emitting device has an improved light-emitting efficiency.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
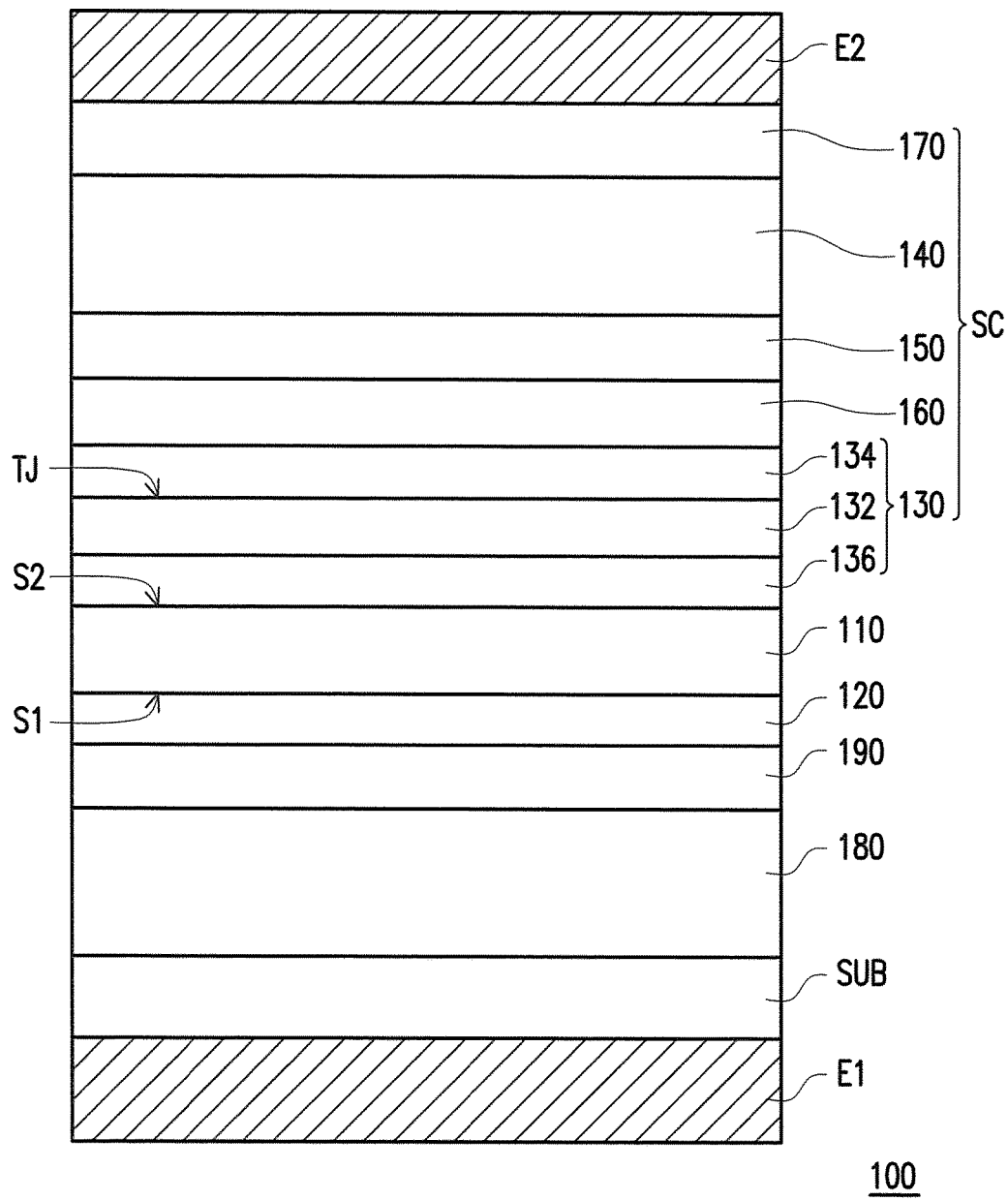
FIG. 1 is a schematic diagram illustrating a semiconductor light-emitting device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram illustrating a semiconductor light-emitting device according to an embodiment of the present invention. Referring to FIG. 1, it should be noted that, appropriate size and thickness of the structure of each layer of a semiconductor light-emitting device 100 are illustrated to clearly explain the structure of each layer of the semiconductor light-emitting device 100. The present invention should not be limited to a relationship of size and thickness of the structure between each layer of the semiconductor light-emitting device 100. In the present embodiment, the semiconductor light-emitting device 100 includes a light-emitting layer 110, a first N-type waveguide layer 120 and a plurality of semiconductor layers SC. The light-emitting layer 110 has a first side S and a second side S2 opposite to the first side S1. The first N-type waveguide layer 120 is disposed at the first side S1 of the light-emitting layer 110, and the semiconductor layers SC are disposed at the second side S2 of the light-emitting layer 110. Specifically, the semiconductor layers SC include at least one waveguide layer 130. In addition, the semiconductor layers SC include at least one P-type semiconductor layer and a plurality of N-type semiconductor layers, and a quantity of the N-type semiconductor layers is more than a quantity of the at least one P-type semiconductor layer.

In the present embodiment, the semiconductor light-emitting device 100 further includes a first N-type semiconductor material layer 180 and a first N-type semiconductor cladding layer 190, and the first N-type semiconductor material layer 180 and the first N-type semiconductor cladding layer 190 are disposed at the first side S1 of the light-emitting layer 110. The first N-type semiconductor cladding layer 190 is disposed between the first N-type semiconductor material layer 180 and the first N-type waveguide layer 120, and the first N-type waveguide layer 120 is disposed between the first N-type semiconductor cladding layer 190 and the light-emitting layer 110.

To be more specific, in the present embodiment, the semiconductor layers SC include a second N-type semiconductor material layer 140, a second N-type semiconductor cladding layer 150 and the afore-mentioned at least one waveguide layer 130. The second N-type semiconductor cladding layer 150 is disposed between the second N-type semiconductor material layer 140 and the afore-mentioned at least one waveguide layer 130, and the afore-mentioned at least one waveguide layer 130 is disposed between the second N-type semiconductor cladding layer 150 and the light-emitting layer 110. Electrons are confined in the light-emitting layer 110 or near the light-emitting layer 110 by the at least one waveguide layer 130 and the first N-type waveguide layer 120 disposed at both sides of the light-emitting layer 110. Therefore, a recombination probability of electrons and holes in the light-emitting layer 110 is increased, such that a light-emitting efficiency of the semiconductor light-emitting device 100 is improved. The first N-type semiconductor cladding layer 190 and the second N-type semiconductor cladding layer 150 are respectively disposed at the first side S1 and the second side S2 of the light-emitting layer 110. For example, materials of the first N-type semiconductor cladding layer 190 and the second N-type semiconductor cladding layer 150 are N-type GaN, N-type AlInGaN or other N-type doped group III-V semiconductor compounds. Moreover, the first N-type semiconductor material layer 180 and the second N-type semiconductor material layer 140 are respectively disposed at the first side S1 and the second side S2 of the light-emitting layer 110 as well, and materials of the N-type semiconductor material layer 180 and the N-type semiconductor material layer 140 are, for example, N-type GaN or other N-type doped group III-V semiconductor compounds. Particularly, the afore-mentioned N-type doping may be realized by doping a N-type dopant of at least one in a group composed by elements including Si, Ge, Sn or C, the present invention is not limited thereto.

In the present embodiment, each of the second N-type semiconductor material layer 140, the second N-type semiconductor cladding layer 150, the first N-type semiconductor material layer 180 and the first N-type semiconductor cladding layer 190 may be a single layer structure, a multi-layered structure, a super lattice structure or a structure of other forms. For example, each of the second N-type semiconductor cladding layer 150 and the first N-type semiconductor cladding layer 190 may be a super lattice structure composed by alternately stacked AlInGaN layers and GaN layers. Furthermore, materials and structures of the afore-mentioned second N-type semiconductor material layer 140, the second N-type semiconductor cladding layer 150, the first N-type semiconductor material layer 180 and the first N-type semiconductor cladding layer 190 are the same or different from each other, the present invention is not limited thereto. In addition, in the present embodiment, the light-emitting layer 110 may include a multiple quantum well (MQW) structure or a quantum well (QW) structure. For instance, the light-emitting layer 110 may include a MQW structure composed by alternately stacking a plurality of GaN layers and a plurality of InGaN layers, and the MQW structure of the light-emitting layer 110 is, for example, a super lattice structure, but the present invention is not limited thereto.

Referring to FIG. 1 again, in the present embodiment, the semiconductor light-emitting device 100 further includes an electron blocking layer (EBL) 160. The electron blocking layer 160 is disposed between the second N-type semiconductor cladding layer 150 and the afore-mentioned at least one waveguide layer 130. Specifically, a band-gap of the electron blocking layer 160 is larger than a band-gap of the light-emitting layer 110. Therefore, the electron blocking layer 160 can be applied for blocking electrons. Because the electrons blocked by the electron blocking layer 160 are confined in the light-emitting layer 110 or near the light-emitting layer 110, a recombination probability of electrons and holes in the light-emitting layer 110 is increased, such that a light-emitting efficiency of the semiconductor light-emitting device 100 is improved. In the present embodiment, a material of the electron blocking layer 160 includes AlGaN, AlInGaN or other semiconductor materials. Moreover, the electron blocking layer 160 is, for example, N-type doped, which is realized by doping a N-type dopant of at least one in a group composed by elements of Si, Ge, Sn or C, the present invention is not limited thereto.

Furthermore, the semiconductor light-emitting device 100 further includes a substrate SUB, a first electrode E1 and a second electrode E2. The first electrode E1 and the second electrode E2 are respectively disposed at the first side S1 and the second side S2 of the light-emitting layer 110. In the present embodiment, the first N-type semiconductor material layer 180 is disposed between the first N-type semiconductor cladding layer 190 and the first electrode E1, and the second N-type semiconductor material layer 140 is disposed between the second N-type semiconductor cladding layer 150 and the second electrode E2. In particular, the semiconductor light-emitting device 100 is electrically connected to a corresponding external electrode via the first electrode E1 and the second electrode E2, and the light-emitting layer 110 emits light via the current transmitted by the corresponding external electrode. In addition, the substrate SUB is disposed between the first N-type semiconductor material layer 180 and the first electrode E1. A material of the substrate SUB is, such as, GaN or other conductive materials. In some embodiments, a single crystal compound having a lattice constant close to a lattice constant of the first N-type semiconductor material layer 180 is adopted as the material of the substrate SUB. Moreover, in some embodiments, the semiconductor light-emitting device 100 may further include an unintentionally doped semiconductor layer disposed between the N-type semiconductor material layer 180 and the substrate SUB. A material of the unintentionally doped semiconductor layer includes, for example, unintentionally doped GaN (u-GaN) or other semiconductor compounds, such that a semiconductor layer formed thereafter can have a better epitaxial quality. Furthermore, in some embodiments, the semiconductor light-emitting device 100 may further include a semiconductor buffer layer disposed between the unintentionally doped semiconductor layer and the substrate SUB. The semiconductor buffer layer is applied to appropriately provide a release of stress, such that an epitaxial quality of the semiconductor light-emitting device 100 is improved.

In the present embodiment, the semiconductor light-emitting device 100 further includes a semiconductor contact layer 170, and the second N-type semiconductor material layer 140 is disposed between the semiconductor contact layer 170 and the second N-type semiconductor cladding layer 150. Particularly, the semiconductor contact layer 170 is disposed between the second electrode E2 and the second N-type semiconductor material layer 140. The semiconductor contact layer 170 is applied to form a great electrical connection between the second N-type semiconductor material layer 140 and the second electrode E2, so as to realize an ohmic contact. A material of the semiconductor contact layer 170 may include InGaN, GaN or other semiconductor compounds. In addition, the semiconductor contact layer 170 may be, for example, N-type doped, which is realized by doping at least one in a group composed by elements of Si, Ge, Sn or C. To be more specific, the semiconductor contact layer 170 may be N-type doped with a high doping concentration, such as doping Si with a doping concentration from $10^{19}$ atoms/cm$^3$ to $10^{21}$ atoms/cm$^3$, preferably with a doping concentration larger than $10^{20}$ atoms/cm$^3$, such that the semiconductor 170 has an improved ohmic contact. Specifically, the material of the semiconductor contact layer 170 may be the same as or different from the material of the second N-type semiconductor material layer 140. In some embodiments, when the material of the semiconductor contact layer 170 is the same as the material of the second N-type semiconductor material layer 140, the semiconductor contact layer 170 and the second N-type semiconductor material layer 140 substantially form an integrated structure, the present invention is not limited thereto.

In the present embodiment, the semiconductor light-emitting device 100 is a semiconductor laser, such as a laser diode (LD). The afore-mentioned at least one waveguide layer 130 of the semiconductor light-emitting device 100 includes a plurality of waveguide layers 130, and the waveguide layers 130 include a P-type waveguide layer 132, a second N-type waveguide layer 134 disposed at a side of the P-type waveguide layer 132 and an unintentionally doped waveguide layer 136. In particular, the second side S2 of the light-emitting layer 110 of the semiconductor light-emitting device 100 has, for example, merely one P-type semiconductor layer (P-type waveguide layer 132), and a thickness thereof is between 20 nm to 30 nm, such that a light absorption of the P-type semiconductor layer can be effectively reduced, as compared to a disposition of a multi-layer P-type semiconductor layers in the prior art. However, the present invention is not limited thereto. In other embodiments, an appropriate quantity of the P-type semiconductor layer may be disposed at the second side S2 or the first side S1 of the light-emitting layer 110 according to actual requirement. In the present embodiment, the P-type waveguide layer 132 is disposed between the second N-type waveguide layer 134 and the light-emitting layer 110, and the unintentionally doped waveguide layer 136 is disposed between the P-type waveguide layer 132 and the light-emitting layer 110. Specifically, materials of the waveguide layers 130 (the P-type waveguide layer 132, the second N-type waveguide layer 134 and the unintentionally doped waveguide layer 136) include InGaN or GaN. Preferably, a material of the P-type waveguide layer 132 includes InGaN. In addition, the P-type waveguide layer 132 is doped with a P-type dopant of a concentration in a range from $10^{18}$ atoms/cm$^3$ to $10^{20}$ atoms/cm$^3$, the P-type dopant includes at least one in a group composed by elements of Mg, Zn, Ca, Sr or Ba. For example, the P-type dopant is Mg herein. In addition, the second N-type waveguide layer 134 is doped with a N-type dopant, such as Si, of a concentration in a range of $10^{18}$ atoms/cm$^3$ to $10^{20}$ atoms/cm$^3$. For example, the P-type waveguide layer 132 is doped with Mg of a concentration of $3\times10^{18}$ atoms/cm$^3$, and the second N-type waveguide layer 134 is doped with Si of a concentration of $10^{19}$ atoms/cm$^3$. Moreover, in the present embodiment, a thickness of the second N-type waveguide layer 134 is in a range of 20 nm to 30 nm. However, the present invention is not limited thereto.

In the present embodiment, a tunnelling junction TJ is formed between the P-type waveguide layer 132 and the second N-type waveguide layer 134. Specifically, by appropriately doping the P-type waveguide layer 132 and the second N-type waveguide layer 134, a valence band of the P-type waveguide layer 132 is aligned with or almost aligned with a conductive band of the second N-type waveguide layer 134. Therefore, electrons can move between the valence band of the P-type waveguide layer 132 and the conductive band of the second N-type waveguide layer 134 by a tunnelling effect, so as to form a transmission of electric current. As a result, electric current applied externally can pass through these waveguide layers 130, such that the light-emitting layer 110 emits light by the electric current applied externally. In particular, in these semiconductor layers SC at the second side S2 of the light-emitting layer 110 of the present embodiment, a quantity of these N-type semiconductor layers (such as the afore-mentioned semiconductor contact layer 170, the second N-type semiconductor material layer 140, the second N-type semiconductor cladding layer 150, the electron blocking layer 160 and the second N-type waveguide layer 134) is more than a quantity of the afore-mentioned at least one P-type semiconductor layer (such as the afore-mentioned P-type waveguide layer 132). In comparison to the prior art, in these semiconductor layers at the second side S2 of the light-emitting layer 110 of the present embodiment, a quantity of the P-type semiconductor layer doped with a Mg element to have a larger light absorbance is smaller than a quantity of the N-type semiconductor layer doped with a Si element to have a smaller light absorbance. In other words, the quantity of the P-type semiconductor layer of the semiconductor light-emitting device 100 is less, so that the P-type semiconductor layer has a smaller absorption amount of the light emitted by the light-emitting layer 110 of the semiconductor light-emitting device 100. Thus, the semiconductor light-emitting device 100 has a relatively low optical loss, such that the semiconductor light-emitting device 100 has an improved light-emitting efficiency.

Figure 2:
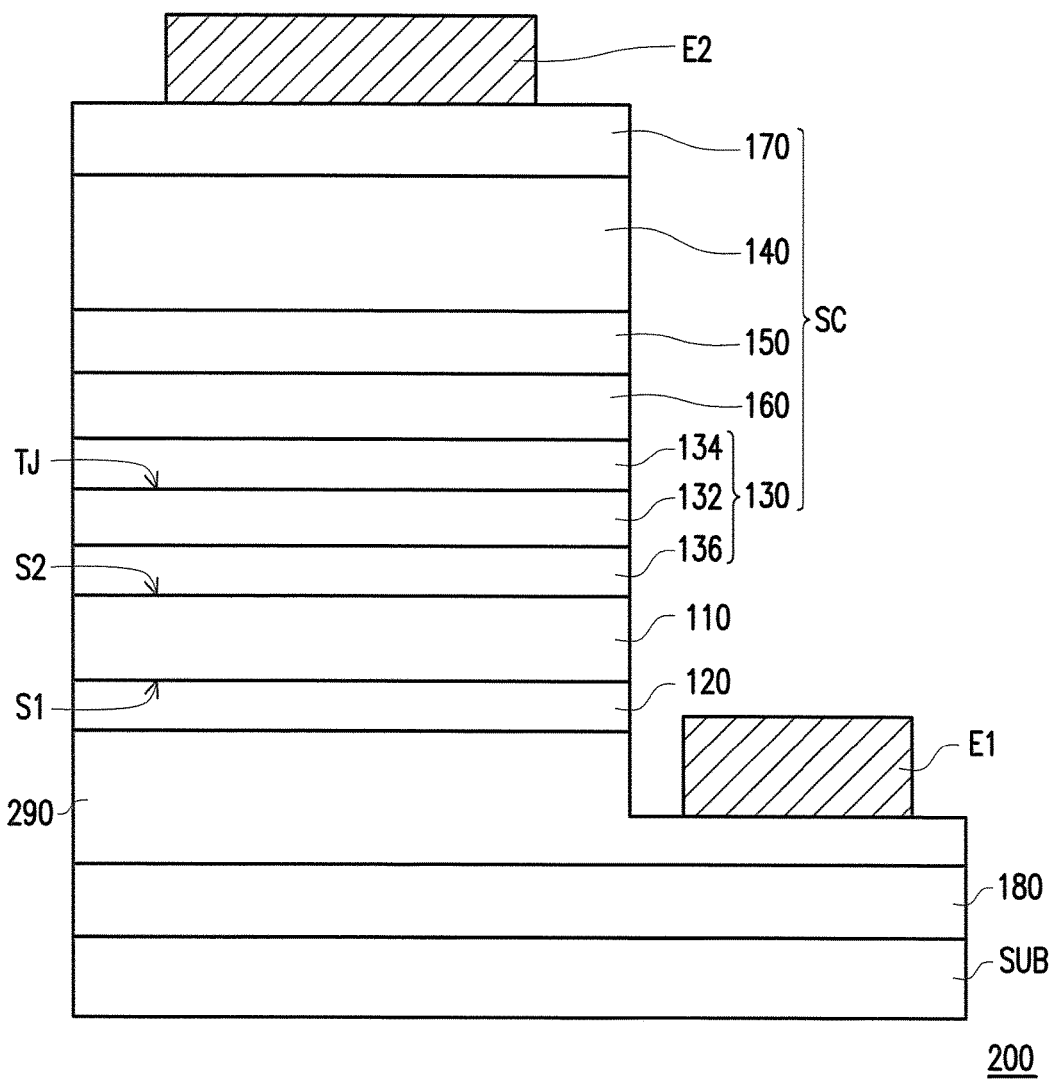
FIG. 2 is a schematic diagram illustrating a semiconductor light-emitting device according to another embodiment of the present invention.

FIG. 2 is a schematic diagram illustrating a semiconductor light-emitting device according to another embodiment of the present invention. Referring to FIG. 2, a semiconductor light-emitting device 200 of the embodiment shown in FIG. 2 is similar with the semiconductor light-emitting device 100 of the embodiment shown in FIG. 1. Components and the related description of the light-emitting device 200 can be referred to the corresponding description of the light-emitting device 100, it would not be stated again herein. Differences between the semiconductor light-emitting device 200 and the semiconductor light-emitting device 100 are stated as follows. In the present embodiment, a first electrode E1 is disposed on a surface at a side of a first N-type cladding layer 290, and a first N-type material layer 180 and a substrate SUB are disposed on a surface at another side of the first N-type cladding layer 290. In addition, the substrate SUB of the semiconductor light-emitting device 200 is such as a sapphire substrate, a GaN substrate or other non-conductive or conductive materials. In particular, the semiconductor light-emitting device 200 is, for example, a laser diode having a lateral structure, and the semiconductor light-emitting device 100 of the embodiment shown in FIG. 1 is such as a laser diode having a vertical structure. However, the semiconductor light-emitting device 100 and the semiconductor light-emitting device 200 may be laser diodes having other types of structures, or light-emitting devices having different types of structures, the present invention is not limited by the afore-mentioned types of structures. Specifically, the semiconductor light-emitting device 200 can at least attain the technical effects of the semiconductor light-emitting device 100 of the embodiment shown in FIG. 1, which include having relatively low optical loss and improved light-emitting efficiency.

As above, the first N-type waveguide layer of the semiconductor light-emitting device of the embodiments of the present invention is disposed at the first side of the light-emitting layer, and the semiconductor layers are disposed at the second side of the light-emitting layer. The semiconductor layers include at least one P-type semiconductor layer and a plurality of N-type semiconductor layers, and a quantity of the N-type semiconductor layers is more than a quantity of the at least one P-type semiconductor layer. Specifically, because the quantity of the P-type semiconductor layer of the embodiments of the present invention is relatively less, so that the P-type semiconductor layer has a relatively low absorption amount of light emitted by the light-emitting layer. As a result, an optical loss of the semiconductor light-emitting device is relatively less, so that the semiconductor light-emitting device has an improved light-emitting efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor light-emitting device, comprising:
   a light-emitting layer, having a first side and a second side opposite to the first side;
   a first N-type waveguide layer, disposed at the first side; and
   a plurality of semiconductor layers, disposed at the second side, wherein the semiconductor layers comprise at least one P-type semiconductor layer and a plurality of N-type semiconductor layers, and a quantity of the N-type semiconductor layers is more than a quantity of the at least one P-type semiconductor layer,
   wherein the at least one P-type semiconductor layer comprises a P-type waveguide layer, the N-type semiconductor layers comprise a second N-type waveguide layer disposed at a side of the P-type waveguide layer.

2. The semiconductor light-emitting device according to claim 1, wherein a tunnelling junction is formed between the P-type waveguide layer and the second N-type waveguide layer.

3. The semiconductor light-emitting device according to claim 1, wherein the P-type waveguide layer is doped with a P-type dopant of a concentration in a range of $10^{18}$ atoms/cm$^3$ to $10^{20}$ atoms/cm$^3$, and the second N-type waveguide layer is doped with a N-type dopant of a concentration in a range of $10^{18}$ atoms/cm$^3$ to $10^{20}$ atoms/cm$^3$.

4. The semiconductor light-emitting device according to claim 1, wherein the semiconductor layers further comprise an unintentionally doped waveguide layer disposed between the P-type waveguide layer and the light-emitting layer.

5. The semiconductor light-emitting device according to claim 1, further comprising a first N-type semiconductor material layer and a first N-type semiconductor cladding layer, the first N-type semiconductor material layer and the first N-type semiconductor cladding layer are disposed at the first side, wherein the first N-type semiconductor cladding layer is disposed between the first N-type semiconductor material layer and the first N-type waveguide layer, and the first N-type waveguide layer is disposed between the first N-type semiconductor cladding layer and the light-emitting layer.

6. The semiconductor light-emitting device according to claim 1, wherein the N-type semiconductor layers comprise a second N-type semiconductor material layer and a second N-type semiconductor cladding layer, the second N-type semiconductor cladding layer is disposed between the second N-type semiconductor material layer and the second N-type waveguide layer, and the second N-type waveguide layer is disposed between the second N-type semiconductor cladding layer and the light-emitting layer.

7. The semiconductor light-emitting device according to claim 6, wherein the N-type semiconductor layers further comprise an electron blocking layer disposed between the second N-type semiconductor cladding layer and the second N-type waveguide layer, wherein a band-gap of the electron blocking layer is larger than a band-gap of the light-emitting layer.

8. The semiconductor light-emitting device according to claim 6, further comprising a semiconductor contact layer, wherein the second N-type semiconductor material layer is disposed between the semiconductor contact layer and the second N-type semiconductor cladding layer.

9. The semiconductor light-emitting device according to claim 8, wherein the semiconductor contact layer is N-type doped with a doping concentration in a range of $10^{19}$ atoms/cm$^3$ to $10^{21}$ atoms/cm$^3$.

10. The semiconductor light-emitting device according to claim 1, wherein a quantity of the at least one P-type semiconductor layer is one.

* * * * *